United States Patent
Liu et al.

(10) Patent No.: US 11,121,699 B2
(45) Date of Patent: Sep. 14, 2021

(54) WIDEBAND FILTER WITH RESONATORS AND INDUCTORS

(71) Applicant: QUALCOMM Incorporated, San Diego, CA (US)

(72) Inventors: Kai Liu, San Diego, CA (US); Rui Tang, San Diego, CA (US); Changhan Hobie Yun, San Diego, CA (US); Mario Francisco Velez, San Diego, CA (US); Jonghae Kim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/279,902

(22) Filed: Feb. 19, 2019

(65) Prior Publication Data

US 2020/0266512 A1 Aug. 20, 2020

(51) Int. Cl.
*H03H 9/54* (2006.01)
*H03H 9/05* (2006.01)
(Continued)

(52) U.S. Cl.
CPC ......... *H03H 9/542* (2013.01); *H01P 1/20309* (2013.01); *H01P 1/20381* (2013.01);
(Continued)

(58) Field of Classification Search
CPC .... H03H 9/542; H03H 9/0542; H03H 9/0547; H03H 3/02; H01P 1/20309;
(Continued)

(56) References Cited

U.S. PATENT DOCUMENTS

| 7,492,242 B2 * | 2/2009 | Carpentier ............... H03H 3/04 333/188 |
| 2008/0135977 A1 | 6/2008 | Meyer et al. |

(Continued)

OTHER PUBLICATIONS

International Search Report and Written Opinion—PCT/US2020/014047—ISA/EPO—dated Jun. 29, 2020.
Liu K., et al., "Investigation Of Integrated Passive Device With Through-silicon Via", Electronic Components and Technology Conference (ECTC), 2012 IEEE 62nd, IEEE, May 29, 2012 (May 29, 2012), pp. 1833-1839, XP032210840, DOI: 10.1109/ECTC.2012.6249087, ISBN: 978-1-4673-1966-9, Sections Introduction, RF Inductors, BPF+TSV, TSV Torroidal Inductor.

*Primary Examiner* — Rakesh B Patel
*Assistant Examiner* — Jorge L Salazar, Jr.
(74) *Attorney, Agent, or Firm* — Qualcomm Incorporated

(57) ABSTRACT

Aspects of the disclosure are directed to a bandpass filter including a first, second, third and fourth resonators, wherein the second and third resonators are in parallel, wherein the first resonator includes a first and second terminals, wherein the second resonator includes a second resonator top terminal and a second resonator bottom terminal, wherein the third resonator includes a third resonator top terminal and a third resonator bottom terminal, wherein the fourth resonator includes a third terminal and a fourth terminal; wherein the first terminal is coupled to the second resonator top terminal, wherein the second terminal is coupled to the third resonator top terminal, wherein the third terminal is coupled to the third resonator bottom terminal, wherein the fourth terminal is coupled to the second resonator bottom terminal; a first inductor coupled to the first and third terminals; and a second inductor coupled to the second and fourth terminals.

2 Claims, 13 Drawing Sheets

(51) Int. Cl.
H03H 3/02 (2006.01)
H01P 1/203 (2006.01)

(52) U.S. Cl.
CPC ............ H03H 3/02 (2013.01); H03H 9/0542 (2013.01); H03H 9/0547 (2013.01)

(58) Field of Classification Search
CPC ....... H01P 1/20381; H01L 2924/19042; H01L 2924/19105; H01L 24/16; H01L 24/97; H01L 2924/1532; H01L 2924/157; H01L 2924/15788; H01L 2924/15313; H01L 2224/97; H01L 2224/16227; H01L 23/481; H01L 23/5227; H01L 2223/6672; H01L 2224/16235; H01L 23/15; H01L 2223/6616; H01L 23/66
USPC .......................... 333/133, 186–189, 193–196
See application file for complete search history.

(56) References Cited

U.S. PATENT DOCUMENTS

| | | |
|---|---|---|
| 2015/0304059 A1 | 10/2015 | Zuo et al. |
| 2015/0333401 A1 | 11/2015 | Maruthamuthu et al. |
| 2017/0187345 A1 | 6/2017 | Yun et al. |
| 2018/0025999 A1 | 1/2018 | Yu et al. |
| 2018/0138126 A1 | 5/2018 | Chen et al. |
| 2019/0035877 A1 | 1/2019 | Yu et al. |

\* cited by examiner

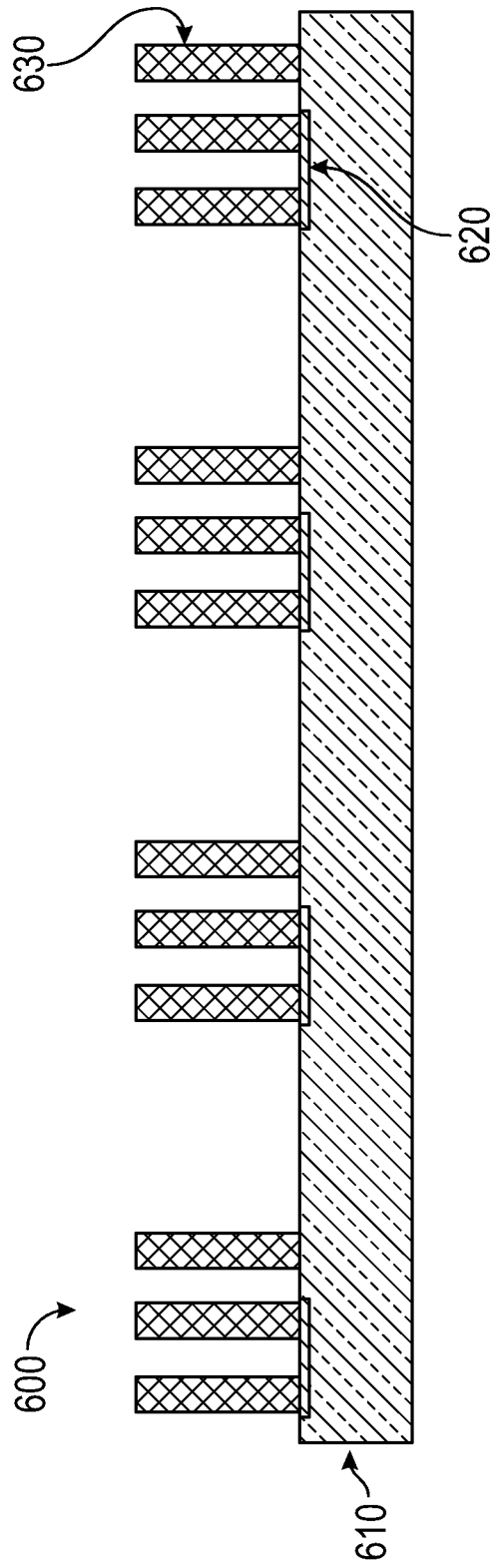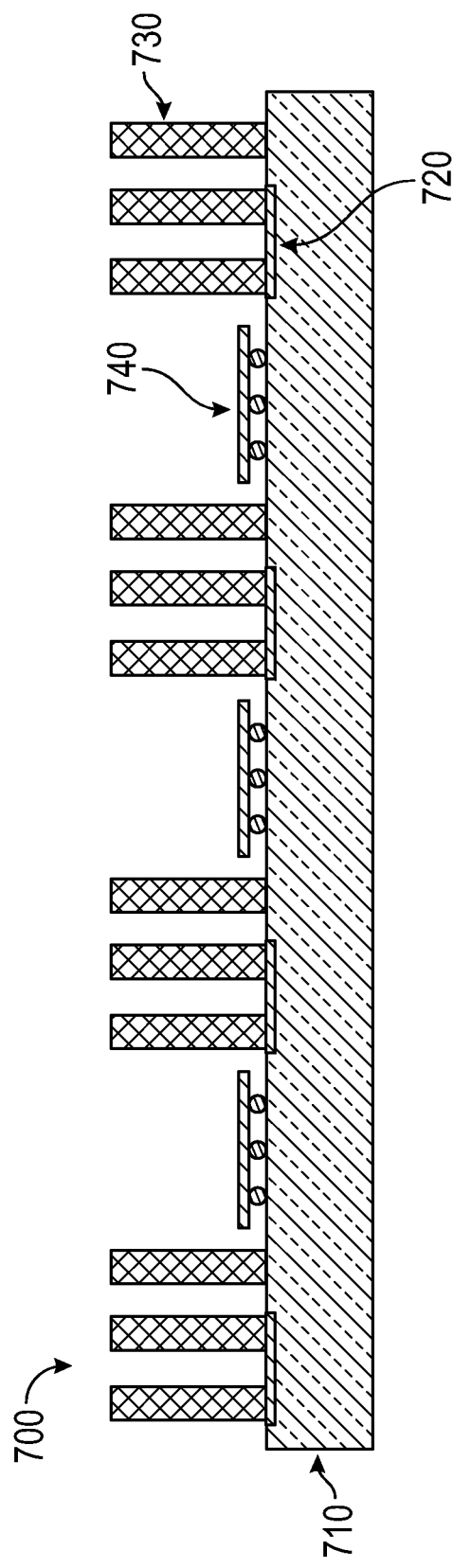

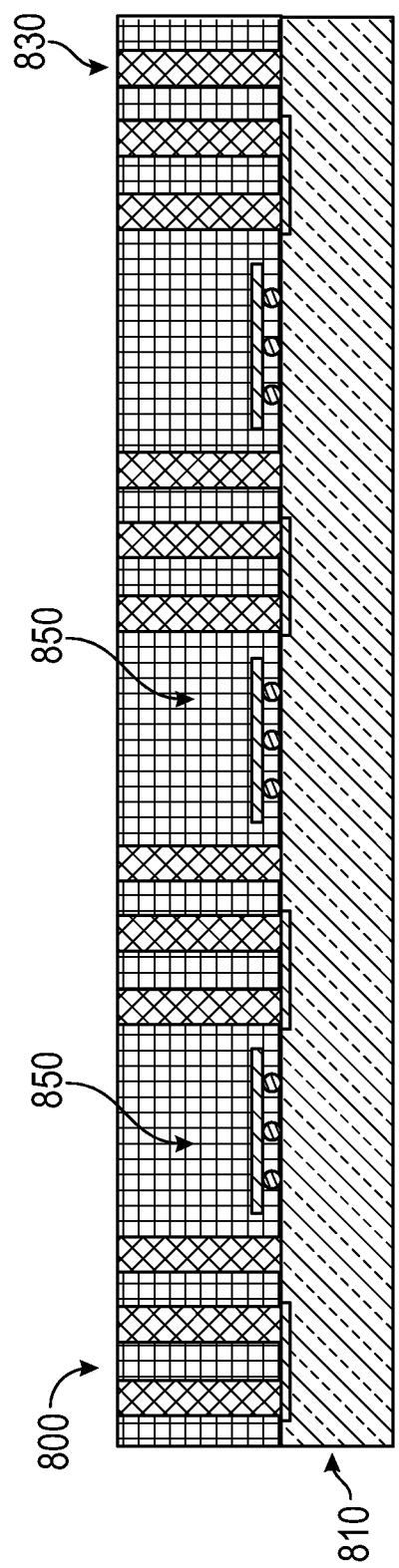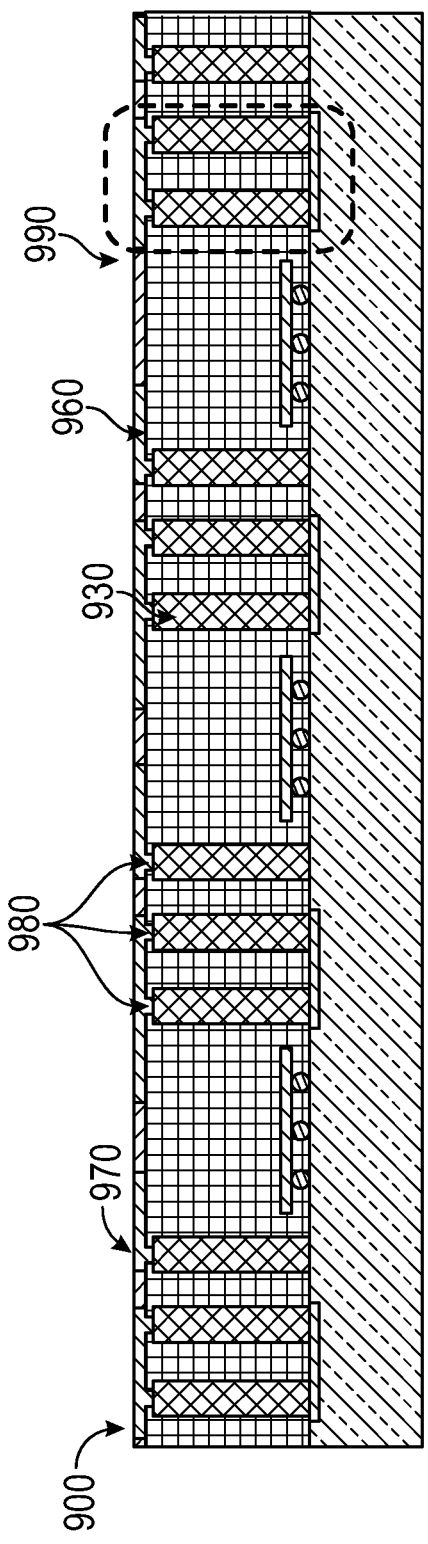

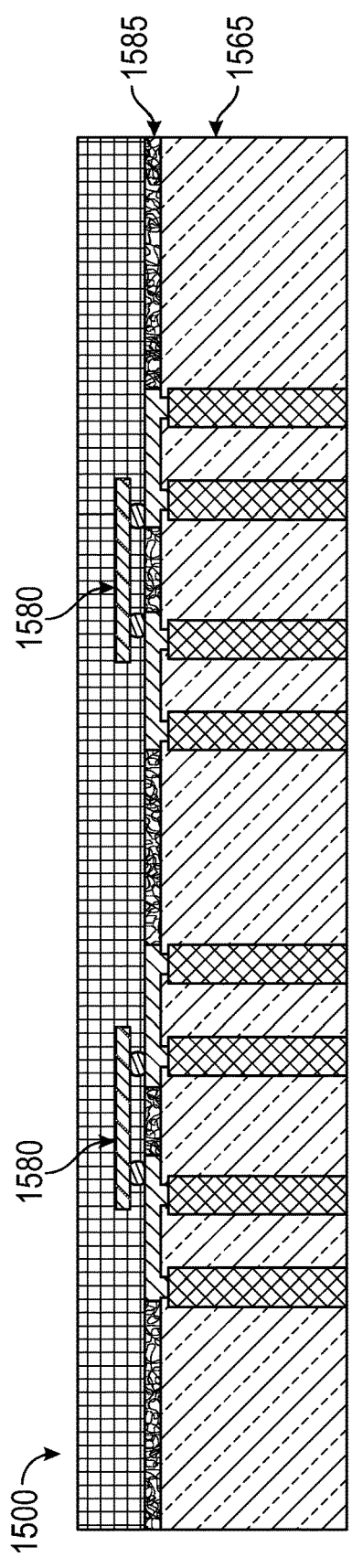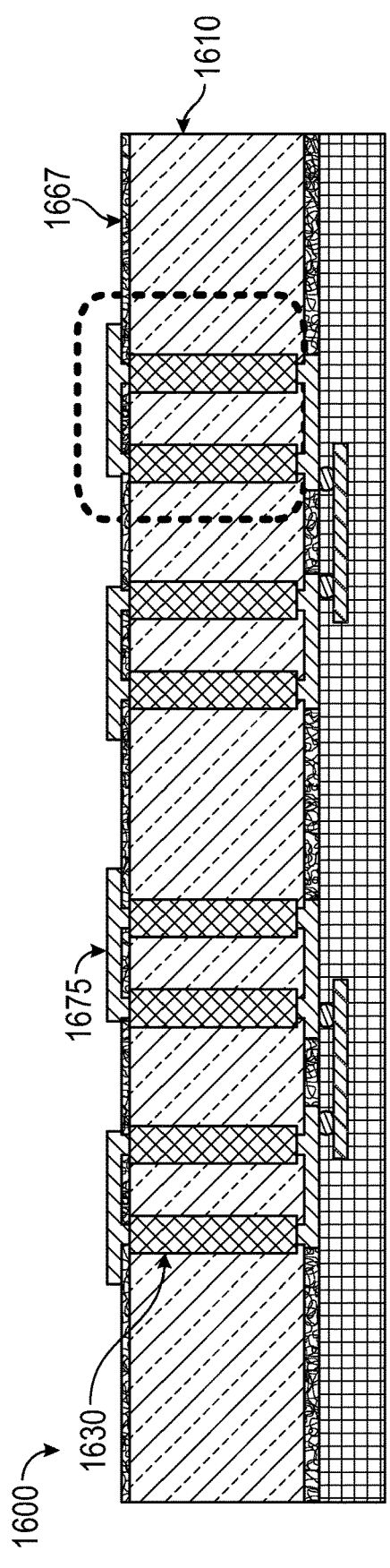

1910
Form a through glass via (TGV) within a wafer layer on an integrated circuit (IC)

1920
Coat a first passivation layer on top of the wafer layer and place a first redistribution layer (RDL) above the first passivation layer, wherein the RDL is placed over one or more vertical conductive pillars

1930
Coat a second passivation layer above the first redistribution layer (RDL) and expose a portion of the second passivation layer for assembling one or more resonator chips

1940
Use a plating process to place one or more interconnection pads above the second passivation layer

1950
Cover the second passivation layer and the one or more resonator chips with a molding material

1960
Flip the integrated circuit (IC), coat the wafer layer with a third passivation layer and place a second redistribution layer (RDL) above the third passivation layer to form a plurality of inductors

1970
Coat a fourth passivation layer above the second redistribution layer (RDL) and create an interconnection layer above the fourth passivation layer

1980
Dice the integrated circuit (IC) to obtain one or more individual bandpass filters

WIDEBAND FILTER WITH RESONATORS AND INDUCTORS

TECHNICAL FIELD

This disclosure relates generally to the field of wideband filtering, and, in particular, to a wideband filter with resonator(s) and inductor(s).

BACKGROUND

Bandpass filters are circuit elements used for selective signal transmission. One type of bandpass filter used at microwave frequencies are bulk acoustic wave (BAW) filters. Some implementations of BAW filters have limited passband widths, typically less than 100 MHz. BAW filter implementations with much wider passband width (e.g., up to 400 MHz) are needed for wideband applications, such as Fifth Generation (5G) wireless communication systems.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a wideband filter with resonator(s) and inductor(s). Accordingly, a method for forming one or more individual bandpass filters on an integrated circuit (IC), the method including positioning a first redistribution layer (RDL) in a wafer layer on the integrated circuit (IC); placing one or more vertical conductive pillars above the wafer layer; forming a plurality of inductors by coating a first passivation layer onto the wafer layer; plating a second redistribution layer (RDL) over the first passivation layer; and coating a second passivation layer above the second redistribution layer (RDL).

In one example, the wafer layer is a molded wafer layer. In one example, the one or more vertical conductive pillars are either copper (Cu) pillars or aluminum (Al) pillars. In one example, the wafer layer is a high-resistivity silicon (HRS) wafer, a gallium arsenide (GaAs) wafer or a glass wafer.

In one example, the method further includes assembling a plurality of resonator chips onto the wafer layer. In one example, one of the plurality of resonator chips is a bulk acoustic wave (BAW) resonator. In one example, the method further includes covering the wafer layer with a molding material to form a molded wafer layer. In one example, the molding material is an epoxy.

In one example, the method further includes using a transfer-molding process or a compression molding process for covering the wafer layer with the molding material. In one example, the method further includes back-grinding the molded wafer layer to expose the one or more vertical conductive pillars. In one example, the method further includes forming an interconnection layer above the second passivation layer. In one example, the interconnection layer includes solder balls or conductive pads. In one example, the method further includes dicing the integrated circuit (IC) to obtain the one or more individual bandpass filters.

Another aspect of the disclosure provides a method for forming one or more individual bandpass filters on an integrated circuit (IC), the method including forming a through glass via (TGV) within a wafer layer on the integrated circuit (IC); coating a first passivation layer on top of the wafer layer; placing a first redistribution layer (RDL) above the first passivation layer, wherein the first RDL is placed over one or more vertical conductive pillars; flipping the integrated circuit (IC); coating the wafer layer with a second passivation layer; and placing a second redistribution layer (RDL) above the second passivation layer to form a plurality of inductors.

In one example, the wafer layer is a high-resistivity silicon (HRS) wafer, a gallium arsenide (GaAs) wafer or a glass wafer. In one example, the method further includes filling the through glass via (TGV) through metallic plating to form the one or more vertical conductive pillars. In one example, the metallic plating is copper plating.

In one example, the method further includes forming the one or more vertical conductive pillars through either a laser drilling process or an etching process. In one example, the method further includes forming the one or more vertical conductive pillars through either a copper plating process or a conductive paste filling process. In one example, the method further includes coating a third passivation layer above the first redistribution layer (RDL) and exposing a portion of the third passivation layer for assembling one or more resonator chips.

In one example, the method further includes using a plating process to place one or more interconnection pads above the third passivation layer. In one example, the one or more resonator chips are assembled on top of the one or more interconnection pads. In one example, the one or more resonator chips is a plurality of bulk acoustic wave (BAW) resonators. In one example, the method further includes covering the third passivation layer and the one or more resonator chips with a molding material. In one example, the molding material is an epoxy.

In one example, the method further includes using a transfer-molding process or a compression molding process for covering the third passivation layer and the one or more resonator chips with the molding material. In one example, the method further includes coating a fourth passivation layer above the second RDL; and creating an interconnection layer above the fourth passivation layer. In one example, the method further includes adding one or more conductive pads or solder balls for creating the interconnection layer. In one example, the method further includes dicing the integrated circuit (IC) to obtain the one or more individual bandpass filters.

Another aspect of the disclosure provides a bandpass filter in an integrated circuit (IC) including a plurality of resonators including a first resonator, a second resonator, a third resonator and a fourth resonator, and wherein the second resonator and the third resonator are in parallel, and wherein the first resonator includes a first terminal and a second terminal, wherein the second resonator includes a second resonator top terminal and a second resonator bottom terminal; wherein the third resonator includes a third resonator top terminal and a third resonator bottom terminal, wherein the fourth resonator includes a third terminal and a fourth terminal, and wherein the first terminal is coupled to the second resonator top terminal, wherein the second terminal is coupled to the third resonator top terminal, wherein the third terminal is coupled to the third resonator bottom terminal, wherein the fourth terminal is coupled to the second resonator bottom terminal; and a first inductor coupled to the first terminal and the third terminal; and a second inductor coupled to the second terminal and the fourth terminal.

Another aspect of the disclosure provides a computer-readable medium storing computer executable code, operable on a device including at least one processor and at least one memory coupled to the at least one processor, wherein the at least one processor is configured to implement one or more individual bandpass filters on an integrated circuit (IC), the computer executable code including instructions for causing a computer to position a first redistribution layer (RDL) in a wafer layer on the integrated circuit (IC); instructions for causing the computer to place one or more vertical conductive pillars above the wafer layer; instructions for causing the computer to assemble a plurality of resonator chips onto the wafer layer; instructions for causing the computer to cover the wafer layer with a molding material to form a molded wafer layer; instructions for causing the computer to form a plurality of inductors by coating a first passivation layer onto the molded wafer layer, by plating a second redistribution layer (RDL) over the first passivation layer and by coating a second passivation layer above the second RDL; instructions for causing the computer to form an interconnection layer above the second passivation layer; and instructions for causing the computer to dice the integrated circuit (IC) to obtain one or more individual bandpass filters.

Another aspect of the disclosure provides a computer-readable medium storing computer executable code, operable on a device including at least one processor and at least one memory coupled to the at least one processor, wherein the at least one processor is configured to implement one or more individual bandpass filters on an integrated circuit (IC), the computer executable code including instructions for causing a computer to form a through glass via (TGV) within a wafer layer on the integrated circuit (IC); instructions for causing the computer to coat a first passivation layer on top of the wafer layer and to place a first redistribution layer (RDL) above the first passivation layer, wherein the first RDL is placed over one or more vertical conductive pillars; instructions for causing the computer to coat a second passivation layer above the first RDL and to expose a portion of the second passivation layer for assembling one or more resonator chips; instructions for causing the computer to use a plating process to place one or more interconnection pads above the second passivation layer; instructions for causing the computer to cover the second passivation layer and the one or more resonator chips with a molding material; instructions for causing the computer to flip the integrated circuit (IC), to coat the wafer layer with a third passivation layer and to place a second RDL above the third passivation layer to form a plurality of inductors; instructions for causing the computer to coat a fourth passivation layer above the second RDL and to create an interconnection layer above the fourth passivation layer; and instructions for causing the computer to dice the integrated circuit (IC) to obtain one or more individual bandpass filters.

These and other aspects of the disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 6 illustrates an example first step for a first integrated circuit (IC) process for a bandpass filter with a combination of resonators on a chip and inductors.

FIG. 7 illustrates an example second step for the first integrated circuit (IC) process for the bandpass filter with the combination of resonators on the chip and inductors.

FIG. 8 illustrates an example third step for the first integrated circuit (IC) process for the bandpass filter with the combination of resonators on the chip and inductors.

FIG. 9 illustrates an example fourth step for the first integrated circuit (IC) process for the bandpass filter with the combination of resonators on the chip and inductors.

FIG. 15 illustrates an example fourth step for the second integrated circuit (IC) process for the bandpass filter with the combination of resonators on the chip and inductors.

FIG. 16 illustrates an example fifth step for the second integrated circuit (IC) process for the bandpass filter with the combination of resonators on the chip and inductors.

FIG. 19 illustrates an example of a second integrated circuit (IC) process flow for manufacturing a bandpass filter with a combination of resonators on a chip and inductors within an integrated circuit (IC).

DETAILED DESCRIPTION

Figure 1:
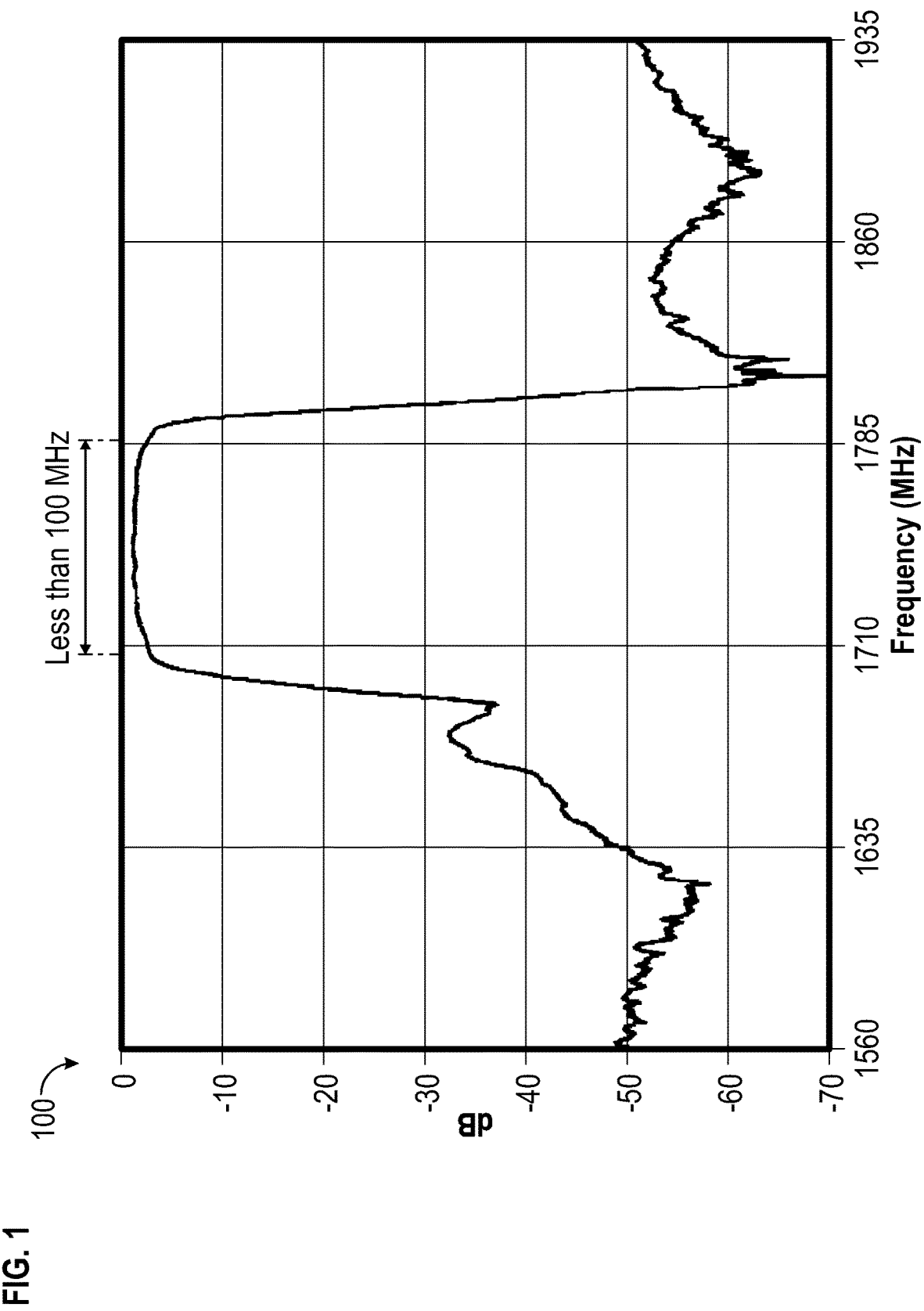
FIG. 1 illustrates an example graph of a filter transfer function for a bulk acoustic wave (BAW) filter.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Electrical circuits which use passive and active circuit elements are widely used to implement a variety of signal processing functions. In one example, signal processing functions may be described in a time domain (i.e., as a function of time) or in a frequency domain (i.e., as a function of frequency). In the frequency domain, for example, signals may be described by a frequency spectrum, e.g., an amplitude response and a phase response over frequency. A filter is a circuit element which relies on frequency domain properties such as a filter transfer function to transform an input frequency spectrum of an input signal into an output frequency spectrum of an output signal. There are many different examples of filters such as low-pass filters, high-pass filters, bandpass filters, bandstop filters, etc.

In one example, electrical circuits include radio frequency front-end (RFFE) modules which may have power amplifiers, low noise amplifiers, switches, filters, and/or transformers, etc. In one example, bandpass filters are circuit elements in electrical circuits which may be used to selectively transmit or reject a signal depending on the frequency spectrum of the signal. For example, the signal may have a frequency spectrum which has significant energy distribution over a range of frequencies from a low frequency $f_{LOW}$ to a high frequency $f_{HIGH}$. A first key characteristic of a bandpass filter is its passband, i.e., a first range of frequencies which is transmitted through the bandpass filter. For example, the passband may be specified by frequency values with a half-power response, e.g., −3 dB amplitude response points.

A second key characteristic of a bandpass filter is its stopband. The stopband is a second range of frequencies which is rejected by the bandpass filter. A third key characteristic of a bandpass filter is its rolloff. The rolloff is the attenuation slope (e.g., dB/MHz) in transitioning from its passband to its stopband. A fourth key characteristic of a bandpass filter is its insertion loss. The insertion loss is the amount of attenuation over its passband. In one example, rolloff (attenuation slope) and insertion loss may be trade parameters in the bandpass filter design. For example, a cascade (i.e., series connection) of individual bandpass filter devices may allow a trade between higher rolloff versus lower insertion loss.

In one example, bandpass filter implementations in the microwave frequency region (e.g., around 1-10 GHz) may include surface acoustic wave (SAW) filters and bulk acoustic wave (BAW) filters. For example, a bandpass filter may be implemented with a plurality of resonators. Resonators are devices which exhibit frequency resonance. In one example, a SAW filter may be implemented using a plurality of SAW resonators. In one example, a BAW filter may be implemented with a plurality of BAW resonators. These SAW/BAW filters may provide sharp rolloff, but relatively narrowband bandpass filtering, for example, a passband of around 100 MHz over a center frequency of around 3 to 6 GHz. One skilled in the art would understand that the passband and center frequency stated herein are mere examples, and that the present disclosure is not limited to the example disclosed herein.

Alternatively, narrowband may be defined as a passband which is less than 5% of the center frequency. However, in some cases, e.g., 5G wireless applications, bandpass filters with relatively wideband bandpass filtering (e.g., a passband of up to 400 MHz) are desired. Alternatively, wideband may be defined as a passband which is greater than 5% of the center frequency. In some examples, SAW/BAW filters are not capable of providing such wideband performance. The present disclosure provides bandpass filter implementations for wideband bandpass filtering in the microwave frequency region with wideband performances, for example, greater than 5% of the center frequency.

FIG. 1 illustrates an example graph 100 of a filter transfer function for a bulk acoustic wave (BAW) filter. In the example graph 100, the vertical axis shows an amplitude response in decibels (dB) and the horizontal axis shows a frequency range in MHz. In FIG. 1, the amplitude response for the BAW filter in shown in the range of −70 dB to 0 dB over a frequency range of 1560 MHz to 1935 MHz. In the example graph 100, a passband width (e.g., between −3 dB amplitude response points) is relatively narrowband (e.g., less than 100 MHz wide).

In one example, the passband may be specified as a relative bandwidth. The relative bandwidth may be defined as a ratio of passband width to center frequency. In the example graph 100, the relative bandwidth is less than 5% in this case (i.e., 75 MHz passband width over 1745 MHz center frequency is about 4.3% relative bandwidth). FIG. 1 shows that the filter transfer function includes a sharp rolloff from the passband to the stopband without achieving a wide passband (e.g., greater than 100 MHz bandwidth). That is, the filter transfer function of the BAW filter includes a sharp rolloff from the passband to the stopband with a passband bandwidth of less than 100 MHz.

Figure 2:
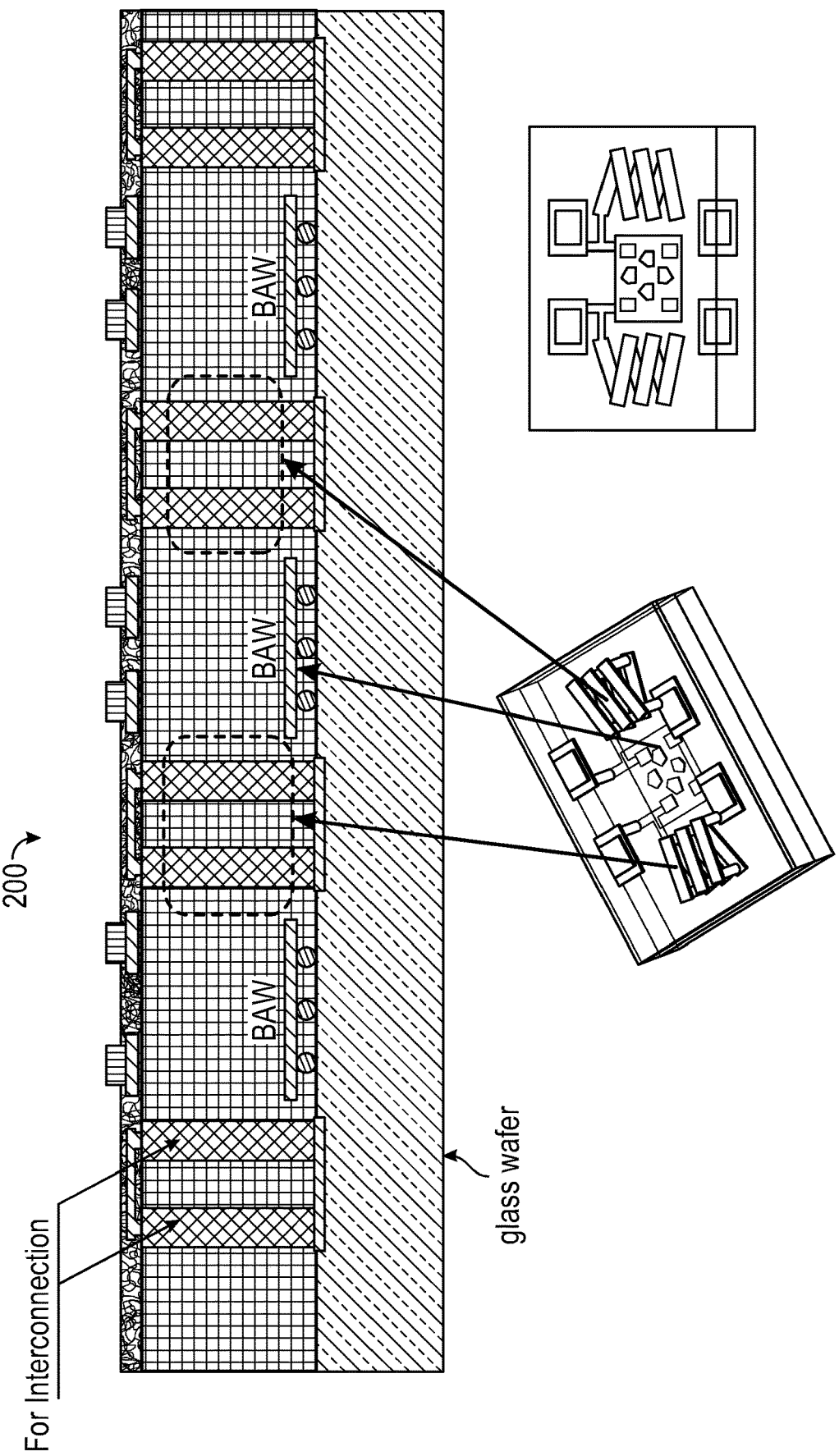
FIG. 2 illustrates an example of a bandpass filter with a combination of bulk acoustic wave (BAW) resonators and inductors.

FIG. 2 illustrates an example of a bandpass filter 200 with a combination of bulk acoustic wave (BAW) resonators and inductors. In one example, the inductors are three-dimensional (3D) inductors. In the bandpass filter 200, a low-loss substrate (e.g., glass wafer) may be used to implement high-Q inductors through a metal plating process. In one example, a high-Q (i.e., high quality) inductor is an inductor with highly resonant behavior. For example, a BAW resonator process cannot be used to implement an inductor, such as a high-Q inductor. In one example, a packaging approach to integrate BAW resonators and inductors forms a wideband bandpass filter with sharp rolloff.

Figure 3:
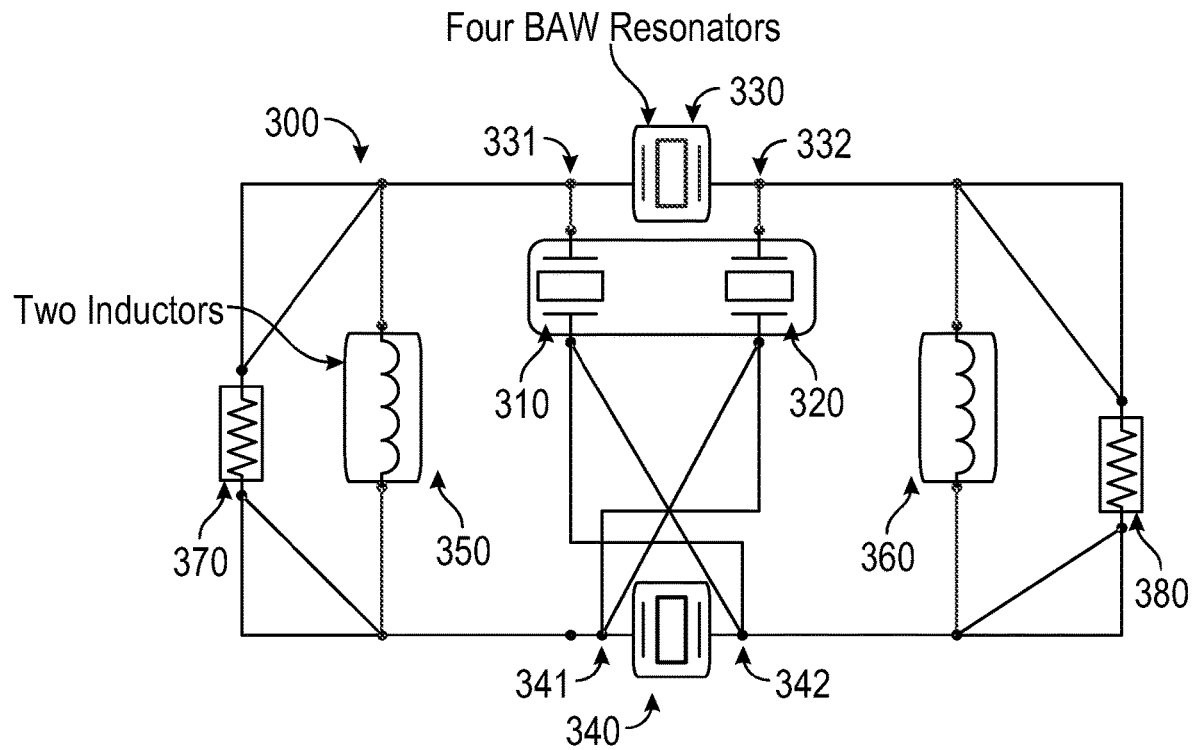
FIG. 3 illustrates an example of an electrical schematic diagram of a bandpass filter with a combination of resonators and inductors.

FIG. 3 illustrates an example of an electrical schematic diagram of a bandpass filter 300 with a combination of resonators and inductors. In one example, the bandpass filter 300 includes four resonators: a first resonator 310, a second resonator 320, a third resonator 330 and a fourth resonator 340. One skilled in the art would understand that although four resonators are shown, other quantities of resonators may be used within the scope and spirit of the present disclosure.

In one example, the first resonator 310 is a first BAW resonator, the second resonator 320 is a second BAW resonator, the third resonator is a third BAW resonator, and the fourth resonator is a fourth BAW resonator. Although BAW resonators are disclosed herein, in some examples, other types of resonators, such as, but not limited to surface acoustic wave (SAW) resonators, may be used.

In one example, the third resonator 330 includes a first terminal 331 and a second terminal 332. And, the fourth resonator 340 includes a first terminal 342 and a second terminal 342. In one example, the first resonator 310 is connected to the first terminal 331 of the third resonator 330 and the second resonator 320 is connected to the second terminal 332 of the third resonator 330 as shown in FIG. 3. In one example, the first resonator 310 is also connected to the second terminal 342 of the fourth resonator 340 and the second resonator 320 is also connected to the first terminal 341 of the fourth resonator 340, as shown in FIG. 3.

In one example, the bandpass filter 300 includes two inductors: a first inductor 350 and a second inductor 360. In one example, the first inductor 350 is a first 3-D inductor and the second inductor 360 is a second 3-D inductor. In one example, the first inductor 350 is connected to the first terminal 331 of the third resonator 330 and to the first terminal 341 of the fourth resonator 340. And, the second inductor 360 is connected to the second terminal 332 of the third resonator 330 and to the second terminal 342 of the fourth resonator 340. One skilled in the art would understand that although two inductors are shown in FIG. 3, that other quantities of inductors may be used within the scope and spirit of the present disclosure.

In one example, the bandpass filter 300 includes two resistors: a first resistor 370 and a second resistor 380. In one example, the first resistor 370 is connected in parallel to the first inductor 350 and the second resistor 380 is connected in parallel to the second inductor 360. In one example, the impedance of the first resistor 370 and of the second resistor 380 is 50 ohms. One skilled in the art would understand that other values of the first resistor 370 and the second resistor 380 may be used within the scope and spirit of the present disclosure. One skilled in the art would understand that although two resistors are shown in FIG. 3, other quantities of resistors may be used within the scope and spirit of the present disclosure.

Figure 4:
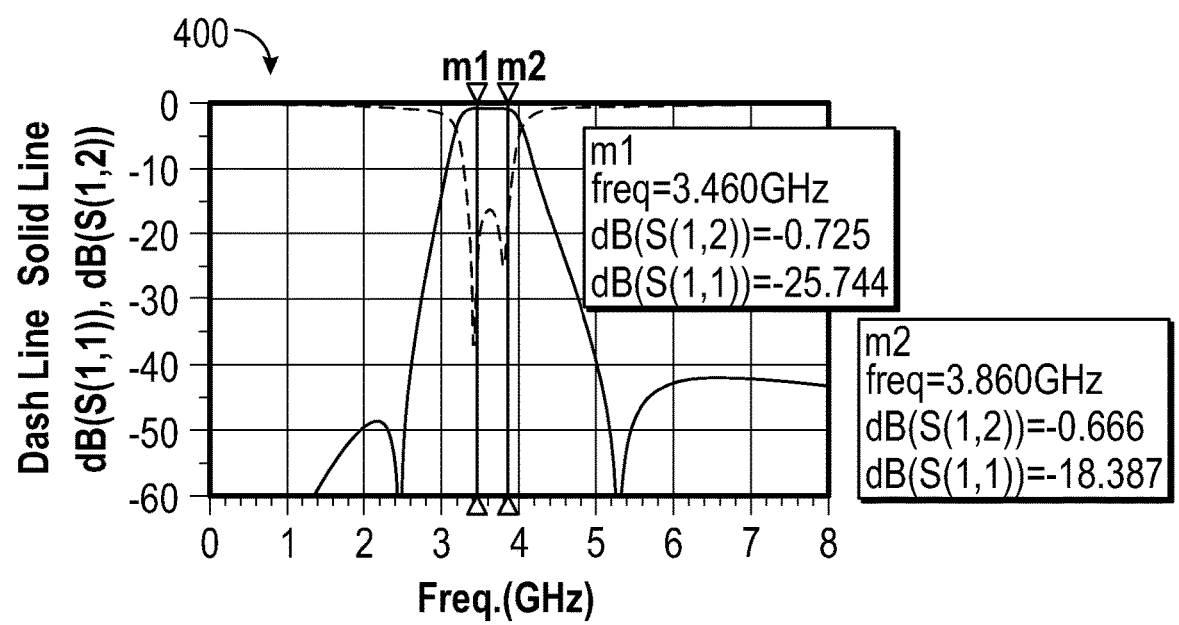
FIG. 4 illustrates an example filter transfer function for a bandpass filter with a combination of resonators and inductors.

FIG. 4 illustrates an example filter transfer function 400 for a bandpass filter with a combination of resonators and inductors. Regarding FIG. 4, amplitude response is shown in the vertical axis and frequency range is shown in the horizontal axis. In the example shown in FIG. 4, the amplitude response in decibels (dB) for the bandpass filter is shown over a frequency range between 1 GHz and 8 GHz. In one example, the amplitude response from a filter input to a filter output is labeled as having two components: S(1,2) which is a transfer function from filter input to filter output and S(1,1) which is a reflection function at the filter input. In this example, a passband width (e.g., between −3 dB amplitude response points) is relatively wide, e.g., greater than 400 MHz wide. For example, at a frequency of 3.460 GHz, an amplitude of −0.725 dB is shown and at a frequency of 3.860 GHz, an amplitude response of −0.666 dB is shown. In one example, the relative bandwidth is greater than 10% in this case. In one example, a sharp rolloff of the bandpass filter is attained.

Figure 5:
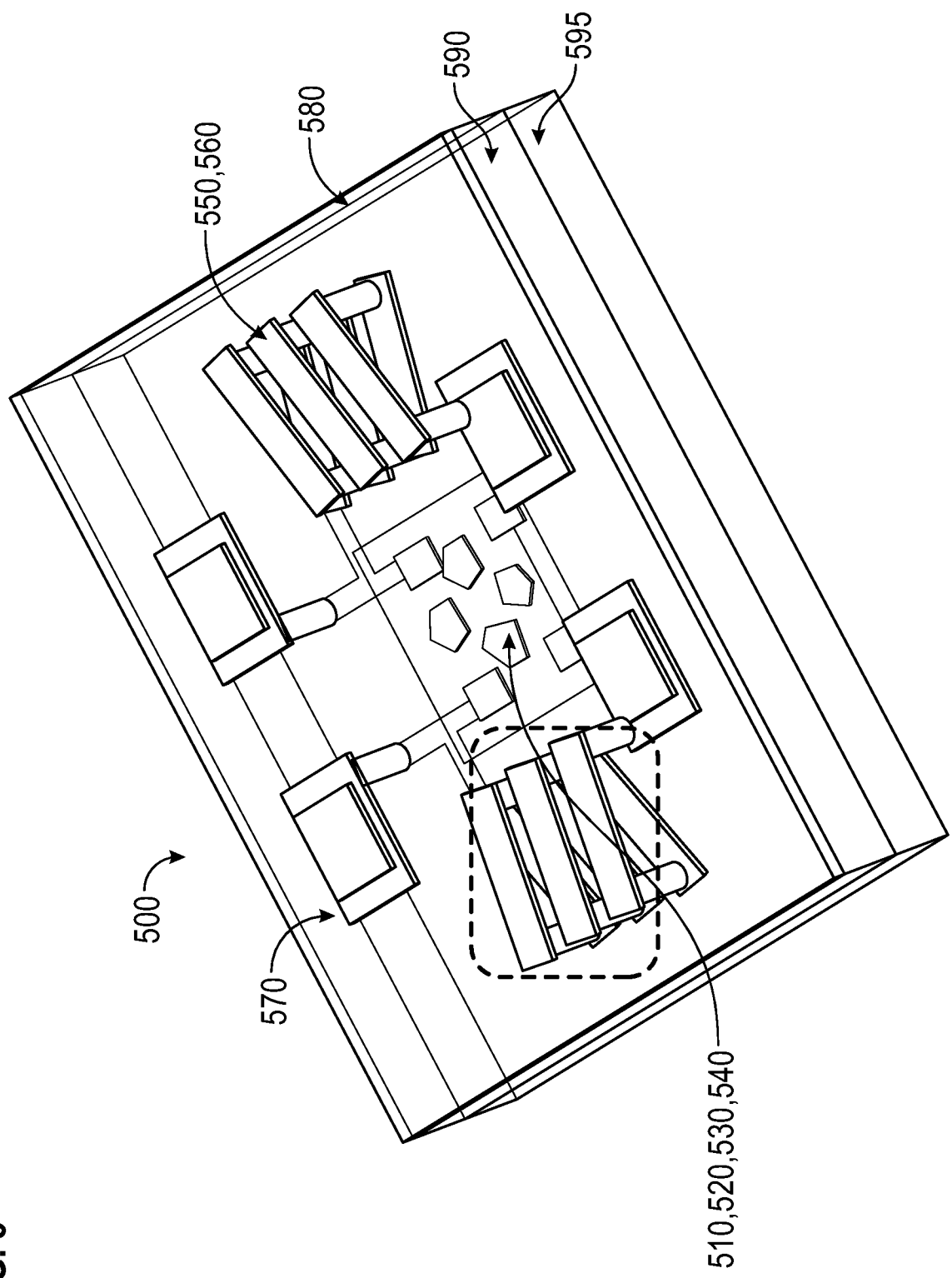
FIG. 5 illustrates an example implementation of a bandpass filter with a combination of resonators on a chip and inductors.

FIG. 5 illustrates an example implementation of a bandpass filter 500 with a combination of resonators on a chip and inductors. For example, a chip is a monolithic integrated circuit. In one example, the bandpass filter 500 includes four resonators: a first resonator 510, a second resonator 520, a third resonator 530 and a fourth resonator 540. In one example, the first resonator 510, the second resonator 520, the third resonator 530 and the fourth resonator 540 are bulk acoustic wave (BAW) resonators embedded in the chip. In another example, one or more of the four resonators is a surface acoustic wave (SAW) resonator. In one example, the bandpass filter 500 includes two inductors: a first inductor 550 and a second inductor 560. In one example, the first inductor 550 and the second inductor 560 are 3-D inductors. In one example, the bandpass filter 500 includes module pads 570 (e.g., electrical connectors), a passivation layer 580, a molding layer 590 and a glass layer 595.

FIG. 6 illustrates an example first step 600 for a first integrated circuit (IC) process for a bandpass filter with a combination of resonators on a chip and inductors. For example, the first IC process is a through mount via (TMV) process. In one example, a wafer layer 610 is used as a substrate for subsequent wafer-level processing. In one example, the wafer layer is a glass wafer. In another example, the wafer layer is a silicon (Si) wafer (e.g., a high resistivity silicon wafer) or a gallium arsenide (GaAs) wafer. In one example, a bottom redistribution layer (RDL) 620 is plated with a wafer-plating process and is positioned in the wafer layer 610. The bottom RDL 620 may serve as a bottom trace of inductors (e.g., 3-D inductors). In one example, vertical conductive pillars 630 are placed above the wafer layer. For example, vertical conductive pillars may be copper (Cu) pillars, aluminum (Al) pillars, or other metallic pillars. For example, vertical conductive pillars may be made through lithographic and wafer-plating processes. In one example, the processes include photoresist (PR), exposure, developing, copper plating, photoresist stripping, etc. For example, the height of the vertical conductive pillars may be 150-200 micrometers (μm), although other dimensions are also within the scope and spirit of the present disclosure.

FIG. 7 illustrates an example second step 700 for the first integrated circuit (IC) process for the bandpass filter with the combination of resonators on the chip and inductors. In one example, a plurality of resonator chips 740 are assembled into the wafer layer 710. In one example, the wafer layer is a glass wafer. For example, the plurality of resonator chips 740 may be a plurality of bulk acoustic wave (BAW) resonators. In another example, the plurality of resonator chips 740 may be a plurality of surface acoustic wave (SAW) resonators. In one example, there is no limitation on the spatial separation between a resonator chip 740 and a vertical conductive pillar 730. In one example, a bottom redistribution layer (RDL) 720 is positioned in the wafer layer 710.

FIG. 8 illustrates an example third step 800 for the first integrated circuit (IC) process for the bandpass filter with the combination of resonators on the chip and inductors. In one example, a wafer layer 810 is covered by a molding material 850 (e.g., epoxy) to create a molded-covered wafer using a molding process such as transfer-molding or compression molding. In one example, the wafer layer is a glass wafer. In one example, the molded-covered wafer may be back-grinded to expose (i.e., remove molding material) vertical conductive pillars 830 for subsequent interconnection processing.

FIG. 9 illustrates an example fourth step 900 for the first integrated circuit (IC) process for the bandpass filter with the combination of resonators on the chip and inductors. In one example, a first passivation layer 960 is coated on top of a molded-covered wafer. In one example, a lithographic process may be used to plate a top RDL 970 and a via connection 980 above the first passivation layer 960 simultaneously. In one example, a second passivation layer 990 may be coated on top of the top RDL 970. In one example, inductors are formed from a combination of a bottom RDL 920, vertical conductive pillars 930 and top RDL 970. Also indicated in FIG. 9, as an example, is a region wherein a 3-D inductor is formed. In one example, the first passivation layer 960 made of polyimide. In one example, the second passivation layer 990 made of polyimide.

Figure 10:
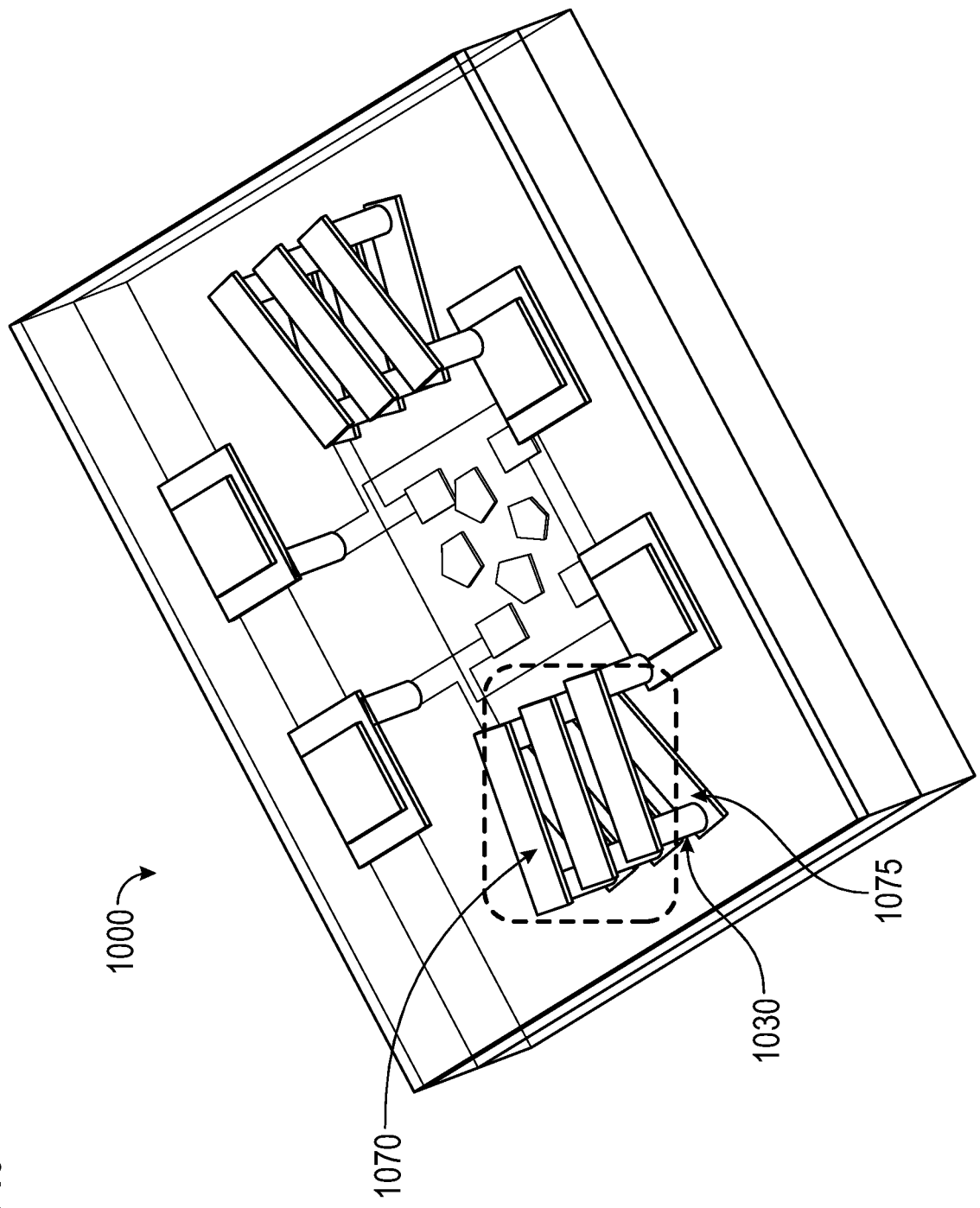
FIG. 10 illustrates an example top view of the first integrated circuit (IC) process for the bandpass filter with the combination of resonators on the chip and inductors.

FIG. 10 illustrates an example top view 1000 of the first integrated circuit (IC) process for the bandpass filter with the combination of resonators on the chip and inductors. Shown in FIG. 10 is a 3-D inductor formed by a bottom RDL 1075, vertical conductive pillars 1030 and a top RDL 1070. Also indicated in FIG. 10, as an example, is a region wherein a 3-D inductor is formed.

Figure 11:
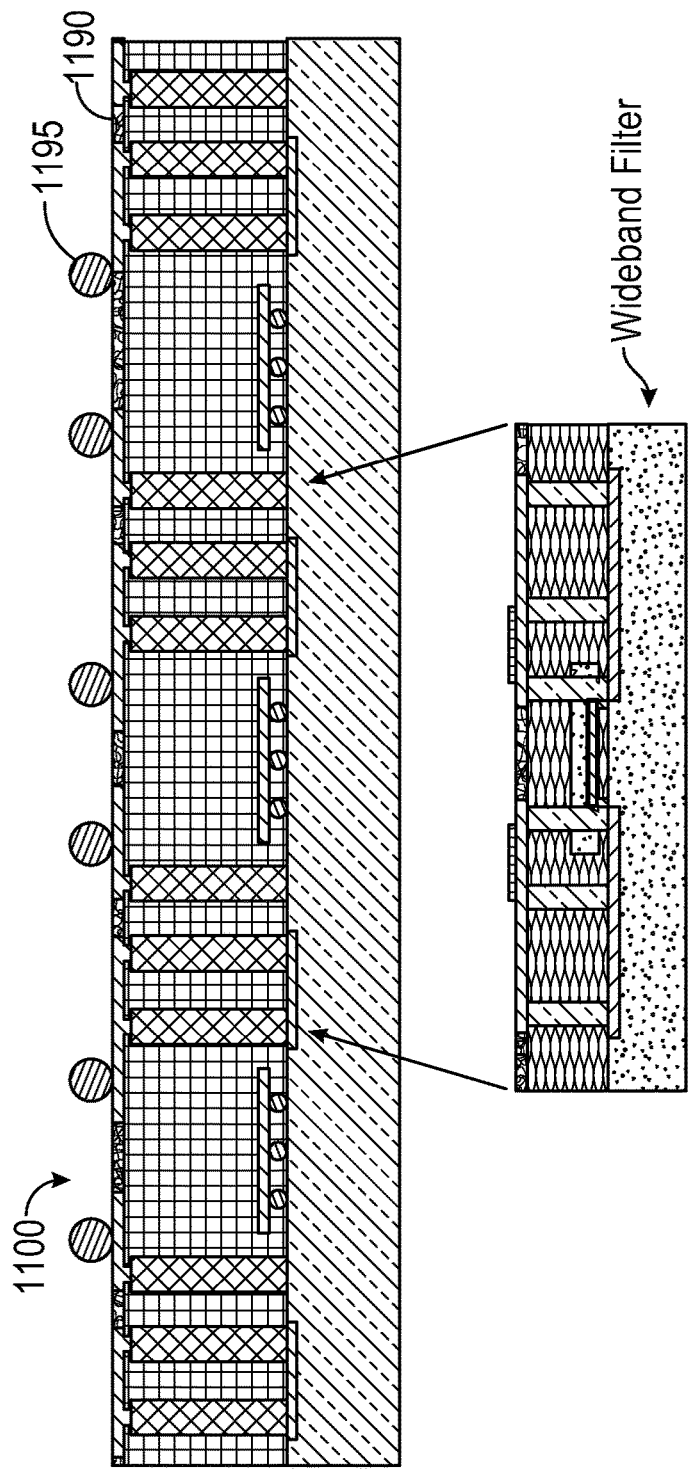
FIG. 11 illustrates an example fifth step for the first integrated circuit (IC) process for the bandpass filter with the combination of resonators on the chip and inductors.

FIG. 11 illustrates an example fifth step 1100 for the first integrated circuit (IC) process for the bandpass filter with the combination of resonators on the chip and inductors. In one example, an interconnection layer 1195 is formed above a second passivation layer 1190. For example, the interconnection layer 1195 may include solder balls or pads or other interconnection elements using a plating process or a ball drop process.

In one example, individual bandpass filter devices may be obtained from the IC through a dicing process. Also, for example, individual bandpass filter devices may be connected in cascade to obtain increased rolloff with higher insertion loss. That is, a cascade (i.e., series connection) of individual bandpass filter devices may allow a trade between higher rolloff vs. lower insertion loss.

Figure 12:
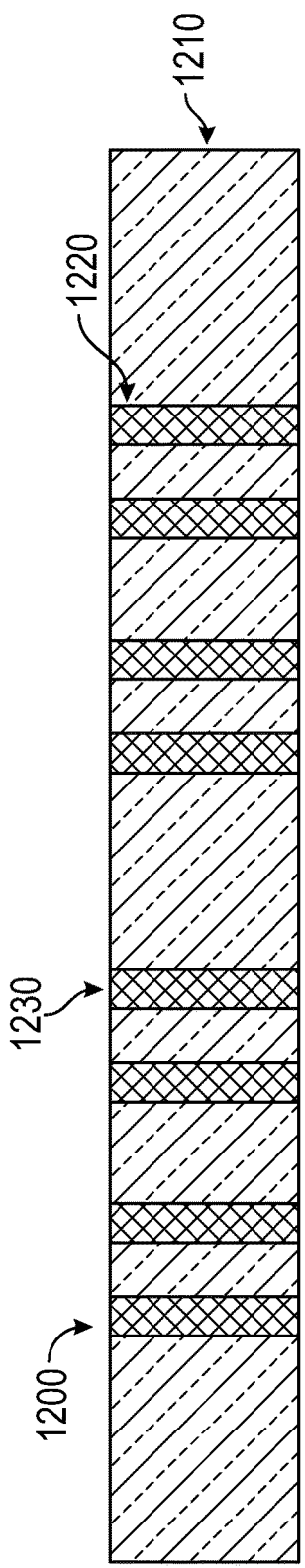
FIG. 12 illustrates an example first step for a second integrated circuit (IC) process for a bandpass filter with a combination of resonators on a chip and inductors.

FIG. 12 illustrates an example first step 1200 for a second integrated circuit (IC) process for a bandpass filter with a combination of resonators on a chip and inductors. For example, the second IC process is a through glass via (TGV) process. In one example, a through glass via (TGV) 1220 is formed within a wafer layer 1210. For example, the wafer layer 1210 may be made of a glass layer or other materials (e.g. high-resistivity silicon (HRS), gallium arsenide (GaAs), etc.). In one example, the through glass via (TGV) 1220 is filled through metallic plating, e.g., copper plating, to form vertical conductive pillars 1230. For example, the vertical conductive pillars 1230 may be made through a laser drill or etching process along with a copper plating or conductive paste filling process. In one example, the vertical conductive pillars 1230 are vertical copper pillars.

Figure 13:
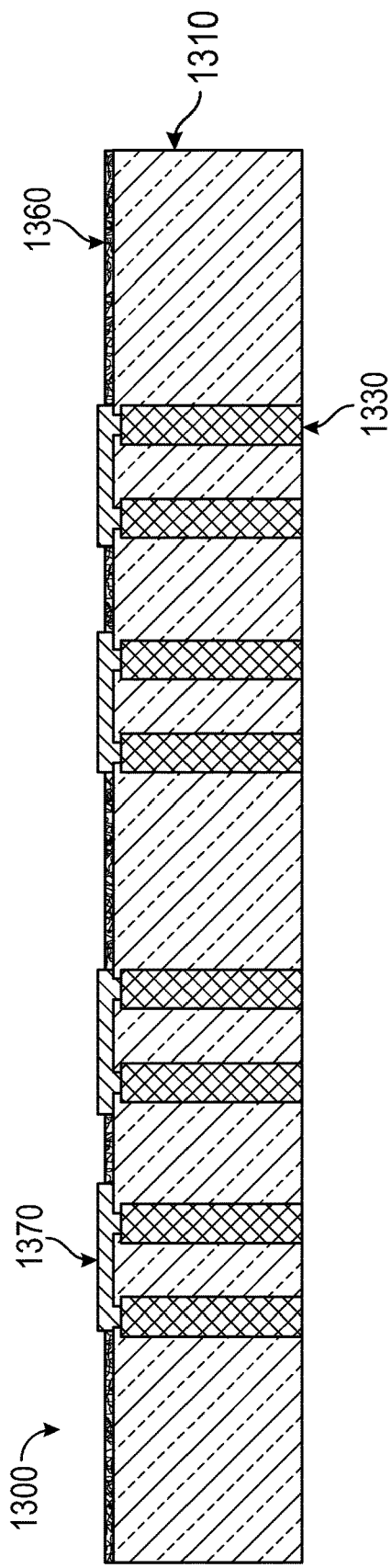
FIG. 13 illustrates an example second step for the second integrated circuit (IC) process for the bandpass filter with the combination of resonators on the chip and inductors.

FIG. 13 illustrates an example second step 1300 for the second integrated circuit (IC) process for the bandpass filter with the combination of resonators on the chip and inductors. In one example, a wafer layer 1310 is coated with a first passivation layer 1360 (e.g., a first dielectric layer). In one example, the first passivation layer 1360 is made of polyimide. In one example, a first redistribution layer (RDL) 1370 is placed above the first passivation layer 1360 over vertical conductive pillars 1330. For example, the first RDL 1370 may be placed using lithographic and plating processes.

Figure 14:
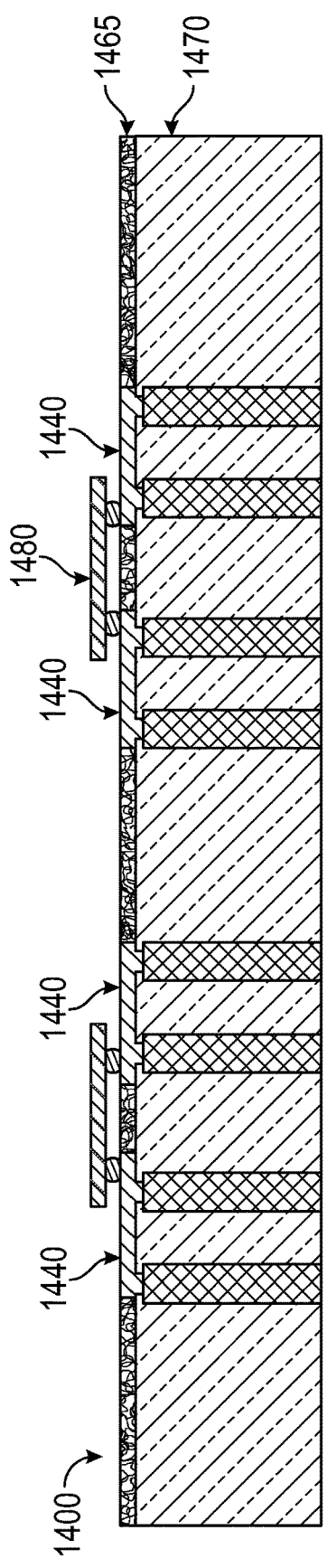
FIG. 14 illustrates an example third step for the second integrated circuit (IC) process for the bandpass filter with the combination of resonators on the chip and inductors.

FIG. 14 illustrates an example third step 1400 for the second integrated circuit (IC) process for the bandpass filter with the combination of resonators on the chip and inductors. In one example, a second passivation layer 1465 (e.g., dielectric material) is coated above the first RDL 1470 and the second passivation layer 1465 is exposed for resonator assembly. In one example, the second passivation layer 1465 is made of polyimide. In one example, interconnection pads 1440 are placed above the second passivation layer 1465 using a plating process. In one example, a plurality of resonator chips 1480 are assembled on top of the interconnection pads 1440. For example, the plurality of resonator chips 1480 may be a plurality of bulk acoustic wave (BAW) resonators.

FIG. 15 illustrates an example fourth step 1500 for the second integrated circuit (IC) process for the bandpass filter with the combination of resonators on the chip and inductors. In one example, a second passivation layer 1565 and a plurality of resonator chips 1580 is covered with a molding material 1585 (e.g., epoxy). In one example, the plurality of resonator chips 1580 may be a plurality of bulk acoustic wave (BAW) resonators. In one example, the covering is performed using a molding process, e.g. transfer molding or compression molding.

FIG. 16 illustrates an example fifth step 1600 for the second integrated circuit (IC) process for the bandpass filter with the combination of resonators on the chip and inductors. In one example, the IC is flipped and a wafer layer 1610 is coated with a third passivation layer 1667. In one example, a second RDL 1675 is placed above the third passivation layer 1667 using lithographic and plating processes. In one example, inductors are formed from a combination of the first RDL (shown in FIG. 13 as 1370), vertical conductive pillars 1630 and a second RDL 1675 as part of a wafer packaging process.

Figure 17:
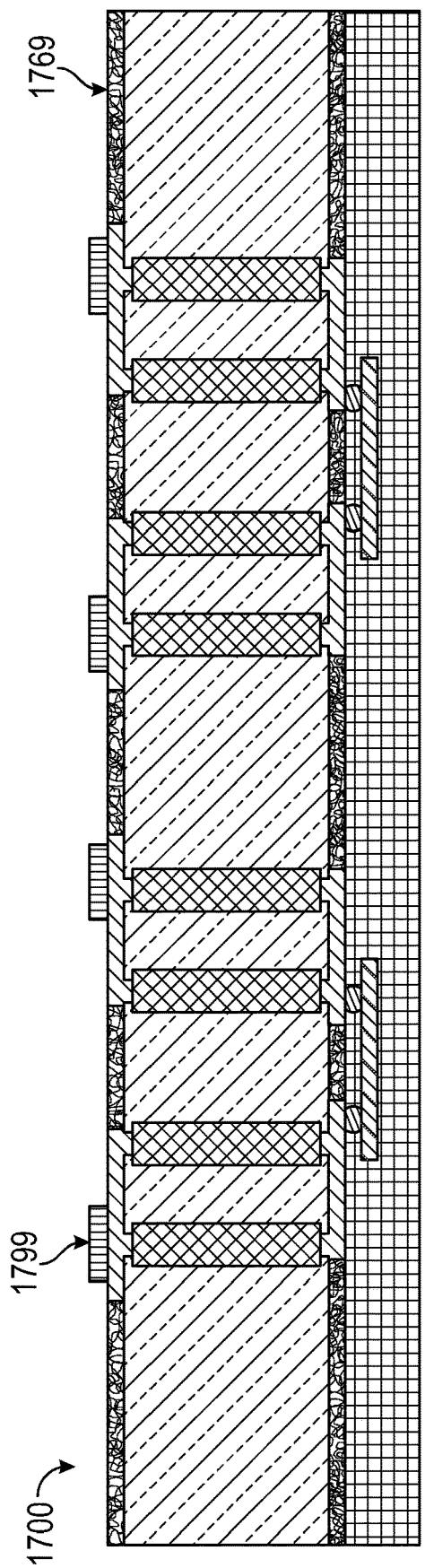
FIG. 17 illustrates an example sixth step for the second integrated circuit (IC) process for the bandpass filter with the combination of resonators on the chip and inductors.

FIG. 17 illustrates an example sixth step 1700 for the second integrated circuit (IC) process for the bandpass filter with the combination of resonators on the chip and inductors. In one example, a fourth passivation layer 1769 is coated above a second RDL and an interconnection layer 1799 is created above the fourth passivation layer 1769. In one example, the interconnection layer 1799 includes package pads or drop balls using lithographic and plating processes.

In one example, individual bandpass filter devices may be obtained from the IC through a dicing process. Also, for example, individual bandpass filter devices may be connected in cascade to obtain increased rolloff with higher insertion loss. That is, a cascade (i.e., series connection) of individual bandpass filter devices may allow a trade between higher rolloff vs. lower insertion loss.

Figure 18:
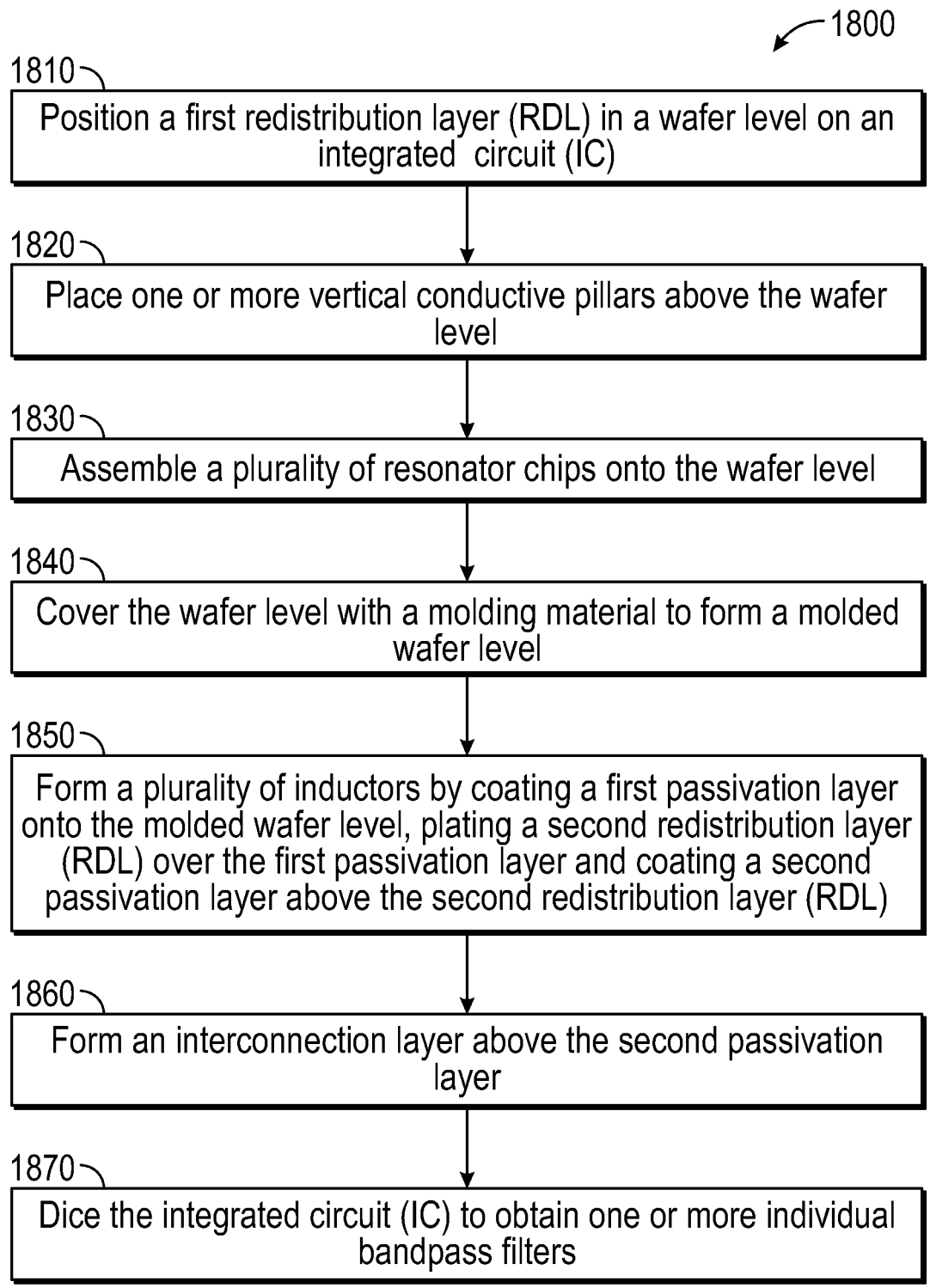
FIG. 18 illustrates an example of a first integrated circuit (IC) process flow for manufacturing a bandpass filter with a combination of resonators on a chip and inductors within an integrated circuit (IC).

FIG. 18 illustrates an example of a first integrated circuit (IC) process flow 1800 for manufacturing a bandpass filter with a combination of resonators on a chip and inductors within an integrated circuit (IC). In one example, the first IC process flow may include a through mold via (TMV). In one example, Through-Mold-Via (TMV) is a vertical interconnection where patterns in both sides of a molding material can be connected. The TMV may be made through a regular plating process using photo-resist (PR) to define vias. After the vias (e.g., copper material) are formed, molding material maybe coated on top and cured. A grinding process may be used to remove some molding material and to expose the vias for a subsequent interconnection process).

In block 1810, position a first redistribution layer (RDL) in a wafer layer on an integrated circuit (IC). In one example, the wafer layer is a glass wafer. In another example, the wafer layer is a high-resistivity silicon (HRS) wafer or a gallium arsenide (GaAs) wafer. For example, the first RDL may be plated using a wafer-plating process and may serve as a bottom trace of inductors.

In block 1820, place one or more vertical conductive pillars above the wafer layer. In one example, the vertical conductive pillars may be copper (Cu) pillars, aluminum (Al) pillars, or other metallic pillars. For example, a height of the vertical conductive pillars may be 150-200 micrometers (μm).

In block 1830, assemble a plurality of resonator chips onto the wafer layer. In one example, the resonator chips are bulk acoustic wave (BAW) resonators. In one example, a spatial separation between the resonator chips and the vertical conductive pillars is not limited except for assembly design rules.

In block 1840, cover the wafer layer with a molding material to form a molded wafer layer. In one example, the molding material is epoxy. In one example, covering the wafer layer is achieved by using a molding process such as transfer-molding or compression molding. In one example, the molded wafer layer may be back-grinded to expose the vertical conductive pillars for subsequent interconnection processing.

In block 1850, form a plurality of inductors by coating a first passivation layer onto the molded wafer layer, plating a second redistribution layer (RDL) over the first passivation layer and coating a second passivation layer above the second RDL. In one example, the first passivation layer and the second passivation layer are made of polyimide. In one example, the plating of the second redistribution layer (RDL) also plates a via connection using a lithographic process. In one example, one or more inductors are formed from the first RDL, the vertical conductive pillars and/or the second redistribution layer (RDL).

In block 1860, form an interconnection layer above the second passivation layer. In one example, the interconnection layer may include one or more of: solder balls, conductive pads and/or other interconnection elements. In one example, the forming of the interconnection layer may use a plating process or a ball drop process.

In block 1870, dice the integrated circuit (IC) to obtain one or more individual bandpass filters.

FIG. 19 illustrates an example of a second integrated circuit (IC) process flow 1900 for manufacturing a bandpass filter with a combination of resonators on a chip and inductors within an integrated circuit (IC). In one example, the second IC process flow may include a through glass via (TGV). In one example, Through-Silicon-Via is a vertical interconnection where patterns in both sides of a silicon wafer can be connected. TSV may be made either through etching process or laser-drilling process. In etch process, some silicon material is etched away, and then filled with plated Cu, Al or other metals. In the laser drilling process, holes maybe created by the laser drilling process, and then maybe filled with plated Cu, Al or other metals.

In block 1910, form a through glass via (TGV) within a wafer layer on an integrated circuit (IC). In one example, the wafer layer may be made of a glass layer or other materials, such as but not limited to high-resistivity silicon (HRS) or gallium arsenide (GaAs), etc. In one example, the through glass via (TGV) may be filled through metallic plating (e.g., copper plating) to form vertical conductive pillars. In one example, vertical conductive pillars may be formed through either a laser drilling process or an etching process. And, in addition, the vertical conductive pillars may be further formed through either a copper plating process or a conductive paste filling process. In one example, the vertical conductive pillars are vertical copper pillars.

In block 1920, coat a first passivation layer on top of the wafer layer and place a first redistribution layer (RDL) above the first passivation layer, wherein the first RDL is placed over one or more vertical conductive pillars. In one example, the first passivation layer is a first dielectric layer. In one example, the first passivation layer is made of polyimide. In one example, the first RDL may be placed using lithographic and plating processes.

In block 1930, coat a second passivation layer above the first RDL and expose a portion of the second passivation layer for assembling one or more resonator chips. In one example, the second passivation layer is a second dielectric layer. In one example, the second passivation layer is made of polyimide.

In block 1940, use a plating process to place one or more interconnection pads above the second passivation layer. In one example, the one or more resonator chips are assembled on top of the one or more interconnection pads. In one example, the one or more resonator chips may be a plurality of bulk acoustic wave (BAW) resonators.

In block 1950, cover the second passivation layer and the one or more resonator chips with a molding material. In one example, the molding material is an epoxy. In one example, a molding process is used to cover the second passivation layer and the one or more resonator chips with the molding material. In one example, the molding process includes transfer molding or compression molding.

In block 1960, flip the integrated circuit (IC), coat the wafer layer with a third passivation layer and place a second RDL above the third passivation layer to form a plurality of inductors. In one example, a lithographic process and/or a plating process are used to place the second RDL above the third passivation layer. In one example, the plurality of inductors is formed from a combination of the first RDL, the vertical conductive pillars and the second RDL as part of a wafer packaging process.

In block 1970, coat a fourth passivation layer above the second RDL and create an interconnection layer above the fourth passivation layer. In one example, the interconnection layer includes package pads or drop balls using lithographic and plating processes. In one example, the interconnection layer is created by adding one or more conductive pads and/or solder balls.

In block 1980, dice the integrated circuit (IC) to obtain one or more individual bandpass filters.

In one aspect, the present disclosure relates to a combination of bulk acoustic wave (BAW) resonators and 3-dimensional (3-D) inductors to provide a bandpass filter with both a wideband passband and a sharp rolloff. The 3-D inductors are implemented using a low-loss substrate, for example a glass wafer, to make high-Q inductors through a metal plating process. The 3-D inductors are integrated with a plurality of BAW resonators to form the bandpass filter. In one example, the 3-D inductors may be made on a glass wafer either through a through-mold-via (TMV) process or a through-glass-via (TGV) process.

In one aspect, the present disclosure provides a high-integration and high-performance filter module with improved tolerance relative to low temperature co-fired ceramic (LTCC) technology and laminate solutions for the inductors. And, in one aspect, the present disclosure discloses methods for providing a small form-factor and/or at a low cost.

In one aspect, one or more of the steps for providing a bandpass filter within an integrated circuit in FIGS. 18 and 19 may be executed by one or more processors which may include hardware, software, firmware, etc. In one aspect, one or more of the steps in FIGS. 18 and/or 19 may be executed by one or more processors which may include hardware, software, firmware, etc. The one or more processors, for example, may be used to execute software or firmware needed to perform the steps in the flow diagrams of FIGS. 18 and 19. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for providing a bandpass filter within an integrated circuit. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

What is claimed is:

1. A bandpass filter in an integrated circuit (IC) comprising:
    a plurality of resonators including a first resonator, a second resonator, a third resonator and a fourth resonator, and wherein the second resonator and the third resonator are in parallel, and
        wherein the first resonator includes a first terminal and a second terminal, wherein the second resonator includes a second resonator top terminal and a second resonator bottom terminal;

wherein the third resonator includes a third resonator top terminal and a third resonator bottom terminal, wherein the fourth resonator includes a third terminal and a fourth terminal, and wherein the first terminal is coupled to the second resonator top terminal, wherein the second terminal is coupled to the third resonator top terminal, wherein the third terminal is coupled to the third resonator bottom terminal, wherein the fourth terminal is coupled to the second resonator bottom terminal; and a first inductor coupled to the first terminal and the third terminal; and a second inductor coupled to the second terminal and the fourth terminal; and a first resistor connected in parallel with the first inductor and a second resistor connected in parallel with the second inductor.

2. The bandpass filter in an integrated circuit (IC) of claim 1, wherein an impedance of the first resistor and the second resistor is approximately 50 ohms.

\* \* \* \* \*